United States Patent [19]
Karlsson

[11] Patent Number: 5,715,141
[45] Date of Patent: Feb. 3, 1998

[54] CONTROL CIRCUIT ARRANGEMENT HAVING A CLAMPING STRUCTURE WHICH CONNECTS A HEAT CONDUCTIVE SUBSTRATE TO A CIRCUIT BOARD AND PROVIDES ELECTRICALLY CONDUCTING LEADS THEREBETWEEN

[75] Inventor: Ulf Bengt Ingemar Karlsson, Tyresö, Sweden

[73] Assignee: Atlas Copco Controls AB, Tyresö, Sweden

[21] Appl. No.: 554,276

[22] Filed: Nov. 6, 1995

[30] Foreign Application Priority Data

Nov. 7, 1994 [SE] Sweden .................. 9403802

[51] Int. Cl.$^6$ .................................................. H05K 7/20
[52] U.S. Cl. ........................ 361/707; 257/727; 361/804
[58] Field of Search ............................ 257/706, 712, 257/713, 718, 727; 174/16.3; 165/80.3, 185; 361/704, 707, 712, 736, 717–719, 742, 744, 745, 803, 804

[56] References Cited

U.S. PATENT DOCUMENTS

| | | | |
|---|---|---|---|
| 3,478,251 | 11/1969 | Perotto | 361/744 |
| 4,483,632 | 11/1984 | Dewey | 374/182 |
| 4,498,120 | 2/1985 | Kaufman . | |
| 4,823,235 | 4/1989 | Suzuki | 361/424 |
| 4,875,140 | 10/1989 | Delpech | 361/412 |
| 4,956,746 | 9/1990 | Gates, Jr. | 361/385 |
| 4,969,065 | 11/1990 | Petri . | |
| 5,008,777 | 4/1991 | Burns . | |
| 5,019,940 | 5/1991 | Clemens | 361/386 |
| 5,065,280 | 11/1991 | Karnezos | 361/386 |
| 5,134,545 | 7/1992 | Smith | 361/388 |
| 5,497,291 | 3/1996 | Hosen | 361/736 |

FOREIGN PATENT DOCUMENTS

| | | |
|---|---|---|
| 3 630 830 A1 | 3/1988 | Germany . |
| 1526321 | 9/1978 | United Kingdom . |
| WO 94/14227 | 6/1994 | WIPO . |

Primary Examiner—Gerald P. Tolin
Attorney, Agent, or Firm—Frishauf, Holtz, Goodman, Langer & Chick

[57] ABSTRACT

A control circuit arrangement for an electric motor drive unit includes a circuit board (10), a heat conductive substrate (12) carrying power semiconductors (13), a heat absorbing mounting structure (14) disposed in heat transferring contact with the heat conductive substrate (12), and a clamping structure (20) for clamping the circuit board (10) and the heat conductive substrate (12) to the mounting structure (14). A number of electrically conductive distance or spacer tube elements (22) are disposed between the circuit board (10) and the heat conductive substrate (12) for distributing the clamping force of the clamping structure (20) from the circuit board (10) to the heat conductive substrate (12) while forming electrically conductive leads between the circuit board (10) and the heat conductive substrate (12).

11 Claims, 1 Drawing Sheet

1

CONTROL CIRCUIT ARRANGEMENT HAVING A CLAMPING STRUCTURE WHICH CONNECTS A HEAT CONDUCTIVE SUBSTRATE TO A CIRCUIT BOARD AND PROVIDES ELECTRICALLY CONDUCTING LEADS THEREBETWEEN

BACKGROUND OF THE INVENTION

This invention relates to a control circuit arrangement for an electric motor drive unit.

In particular, the invention concerns a control circuit arrangement which comprises a circuit board, a heat conductive substrate carrying power semiconductors, and a heat absorbing mounting structure disposed in a heat transferring contact with the heat conductive substrate.

A control circuit arrangement of this type is previously described in British Patent No. 1,526,321.

The primary object of the invention is to provide a compact control circuit arrangement which includes a clamping structure for pressing the circuit board and the heat conductive substrate toward each other as well as toward the mounting structure, and a rigid distance or spacing members disposed between the circuit board and the heat conductive substrate for providing a large area heat transferring contact pressure between the heat conductive substrate and the mounting structure.

A further object of the invention is to provide a control circuit arrangement which includes a clamping structure for pressing the circuit board and the heat conductive substrate toward each other as well as the heat conductive substrate toward the mounting structure, and a number of electrically conductive distance or spacing pieces which are disposed between the circuit board and the heat conductive substrate and arranged to form high capacity electrical leads between the circuit board and the heat conductive substrate and which are suitable for surface mounting by soldering or gluing on the heat conductive substrate.

Further objects and advantages of the invention will appear from the following specification in which a preferred embodiment of the invention is described in detail with reference to the accompanying drawings.

DETAILED DESCRIPTION

Figure 1:
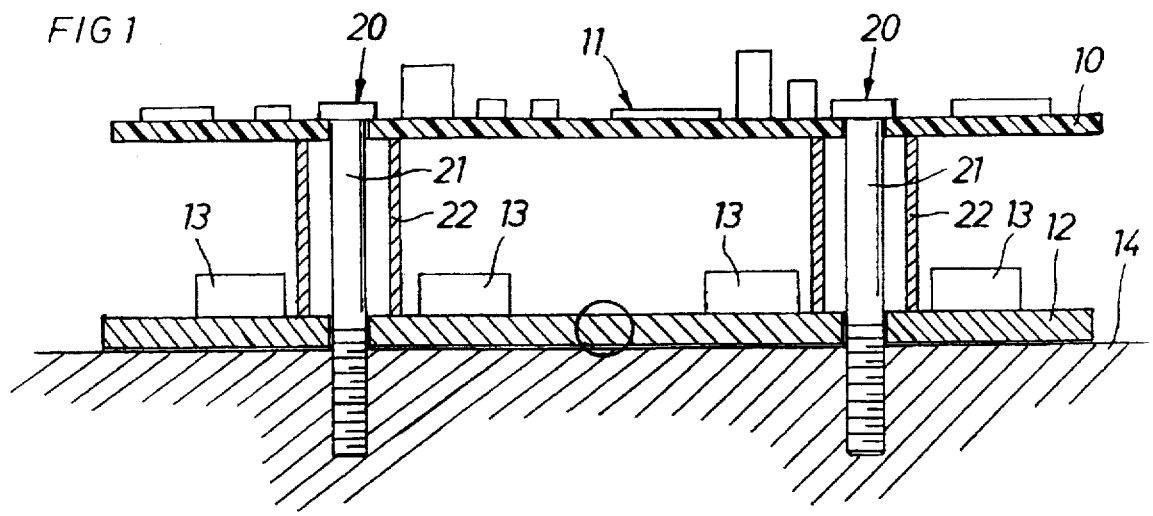
FIG. 1 shows schematically a section through a control circuit arrangement according to the invention.

The control circuit arrangement illustrated in the drawing figures comprises a circuit board 10 which carries a number of logic components 11 connected to copper foil leads on the underside of the circuit board 10, a heat conductive substrate 12 carrying a number of power semiconductors 13, and a heat absorbing mounting structure 14. Preferably, the latter comprises an extruded aluminum profile which forms part of a supporting framework.

In this embodiment of the invention the circuit board 10 carries a number of logic components 11, but may in an alternative embodiment be formed as a pure connector board.

Figure 2:
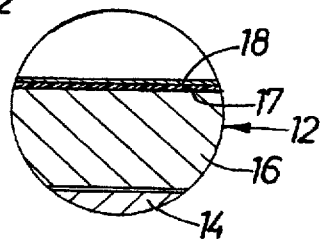
FIG. 2 shows on a larger scale a fractional section of the metal substrate shown in FIG. 1.

The heat conductive substrate 12 which is a so called IMS (Insulated Metal Substrate), comprises (see FIG. 2) an insulated metal plate 16, provided with an insulating layer 17 of a nonconducting material, like a polymer/ceramic material, and having on top a copper foil 18 by which leads are formed to interconnect the power semiconductors 13.

All of the semiconductors 13 are surface mounted on the substrate 12 by soldering or by gluing with a thermally and electrically conductive glue so as to obtain an efficient heat transferring contact between the semiconductors 13 and the metal substrate 12.

The circuit board 10 and the substrate 12 are clamped together and to the mounting structure 14 by means of a number of screw joints 20. Each of these screw joints 20 comprises a screw 21 which extends through the circuit board 10 as well as the substrate 12 and is secured to the mounting structure 14. Between the circuit board 10 and the substrate 12 there are inserted distance or spacing pieces in the form of metal tube elements 22, each surrounding a clamping screw 21. Accordingly, the tube elements 22 are disposed endwise between the circuit board 10 and the substrate 12, thereby transferring the clamping force exerted by the screws 21 on the circuit board 10 to the substrate 12 and accomplishing a contact pressure between the substrate 12 and the mounting structure 14.

Since the tube elements 22 have a relatively large contact area visavi the substrate 12, the contact pressure between the substrate 12 and the mounting structure 14 is distributed over a relatively large area, which means that the conditions are good for obtaining an efficient heat transfer from the substrate 12 to the mounting structure 14. To facilitate further this heat transfer, a thermal grease may be applied between the substrate 12 and the mounting structure 14.

By forming one or more of the tube elements 22 of a conductive material, like steel or any other suitable metal, there is obtained one or more electric leads between the circuit board 10 and the substrate 12. Like the power semiconductors 13, the tube elements 22 are surface soldered to the copper foil 18 on the substrate 12. This mounting as well as the mounting of the semiconductors 13 may very well be carried out automatically. Alternatively, the tube elements 22 may be secured to the substrate 12 by a thermally and/or electrically conductive glue.

Figure 3:
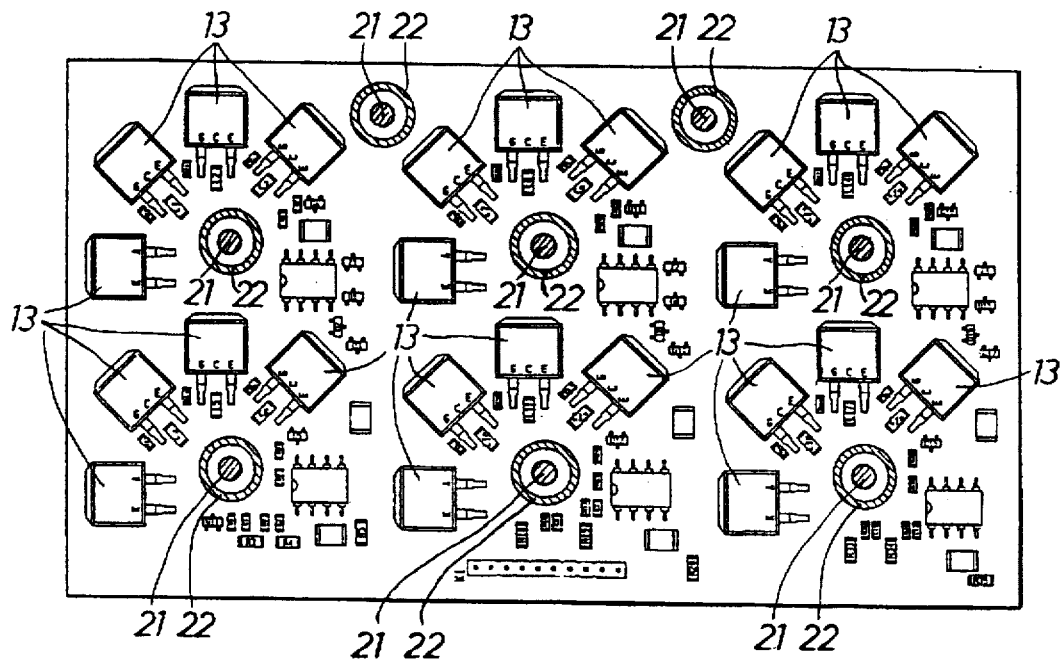
FIG. 3 shows, partly in section, a top view of a semiconductor carrying metal substrate.

As illustrated in FIG. 3, the semiconductors 13 are disposed in symmetrical patterns around the tube elements 22, which means that the leads formed by the copper foil are of substantially the same length between the tube elements 22 and the semiconductors 13. This means that the impedance in the copper foil leads is about the same for all components. It also means that all of the semiconductors 13 are located as close as possible to the heat transferring contact areas provided by the clamping action of the tube elements 22, i.e. the circular area around each tube element 22.

The circuit board 10 and the substrate 12 are connected to each other as well as to external circuits and equipment by multicontact connectors of conventional types which do not form any part of the invention and which, therefore, are not described in detail.

It is to be noted, however, that the embodiments of the invention are not limited to the described example but can be freely varied within the scope of the claims.

Accordingly, the screw joints 20 may be of a completely different design or be omitted entirely. For instance, instead of having the screws 21 extend coaxially through each one of the tube elements 22, there may be used one or several screws which are located between the tube elements 22 in a pattern where the clamping forces of the screws are evenly distributed to the tube elements 22 and to the substrate 12.

Another embodiment of the invention may include a clamping structure in the form of one or more spring elements acting on the circuit board 10 in one or several locations to transfer the clamping force to the tube elements 22. The spring or springs may be coupled to the mounting structure 14 via anchor bolts extending through the circuit board 10 and the substrate 12 or via a framework surrounding the circuit board 10.

I claim:

1. A control circuit arrangement for an electric power unit, comprising:

a circuit board (10);

a heat conductive substrate (12) carrying power controlling semiconductors (13), said heat conductive substrate (12) and said circuit board (10) being arranged in parallel and spaced apart from each other;

a heat absorbing mounting structure (14) disposed in heat transferring contact with said heat conductive substrate (12);

a clamping structure (20) coupled to said circuit board (10) and to said heat conductive substrate (12) for securing said circuit board (10) and said heat conductive substrate (12) relative to each other as well as to said mounting structure (14); and a number of distance or spacing pieces (22) disposed between said circuit board (10) and said heat conductive substrate (12) to transfer a clamping force applied by said clamping structure (20) on said circuit board (10) to said heat conductive substrate (12), thereby clamping said heat conductive substrate (12) against said mounting structure (14);

wherein:

each of said distance or spacing pieces (22) comprises a tube element (22) arranged endwise between said circuit board (10) and said heat conductive substrate (12) so as to axially extend therebetween, and each tube element (22) being comprised at least partly of an electrically conductive material so as to form an electrically conducting lead between said circuit board (10) and power controlling semiconductors carried by said heat conductive substrate (12); and said clamping structure (20) comprises a plurality of screws (21) extending through both of said circuit board (10) and said heat conductive substrate (12) and being secured to said mounting structure (14), each of said screws (21) extending substantially coaxially through a respective one of said tube elements (22).

2. A control circuit arrangement according to claim 1, wherein said tube elements (22) are soldered to said heat conductive substrate (12).

3. A control circuit arrangement according to claim 1, wherein said tube elements (22) are secured to said heat conductive substrate (12) by a thermally conductive glue.

4. A control circuit arrangement according to claim 1, wherein said tube elements (22) are secured to said heat conductive substrate (12) by an electrically conductive glue.

5. A control circuit arrangement according to claim 1, wherein said tube elements (22) are secured to said heat conductive substrate (12) by an electrically and thermally conductive glue.

6. A control circuit arrangement according to claim 1, wherein a thermal grease is provided between said heat conductive substrate (12) and said mounting structure (14).

7. A control circuit arrangement according to claim 1, wherein said tube elements are made of metal.

8. A control circuit arrangement according to claim 2, wherein said tube elements are made of metal.

9. A control circuit arrangement according to claim 3, wherein said tube elements are made of metal.

10. A control circuit arrangement according to claim 4, wherein said tube elements are made of metal.

11. A control circuit arrangement according to claim 5, wherein said tube elements are made of metal.

* * * * *